United States Patent [19]
Henderson et al.

[11] Patent Number: 5,240,580
[45] Date of Patent: Aug. 31, 1993

[54] CONMAG SHIELD

[75] Inventors: David E. Henderson; Ronney L. White, both of Fremont; Forest P. Kreiss, Gilroy, all of Calif.

[73] Assignee: VLSI Technology, Inc., San Jose, Calif.

[21] Appl. No.: 864,892

[22] Filed: Apr. 2, 1992

[51] Int. Cl.$^5$ .............................. C23C 14/34
[52] U.S. Cl. ..................... 204/192.12; 204/298.11; 204/298.18
[58] Field of Search ............. 204/192.12, 298.09, 204/298.11, 298.14, 298.18, 298.19, 298.21

[56] References Cited

U.S. PATENT DOCUMENTS

| | | | |
|---|---|---|---|
| 4,414,086 | 11/1983 | Lamont, Jr. | 204/298.18 X |
| 4,472,259 | 9/1984 | Class et al. | 204/298.18 |
| 4,564,435 | 1/1986 | Wickersham | 204/298.18 X |
| 4,661,228 | 4/1987 | Mintz | 204/298.18 X |
| 4,673,480 | 6/1987 | Lamont, Jr. | 204/298.18 |

*Primary Examiner*—Nam X. Nguyen
*Attorney, Agent, or Firm*—Patrick T. King

[57] ABSTRACT

An improved shielding assembly is provided for a sputter source which has an anode and cathode target-ring assembly mounted to a cylindrical mounting structure. A cooling assembly for the anode and cathode target-ring assembly is mounted to the distal end of the cylindrical mounting structure. A baffle shield member has an outer flat ring-shaped mounting base-portion which overlies the cooling assembly and from which a baffle portion inwardly extends toward the anode and cathode target-ring assembly. A shield member comprises an annular ring base portion, which is mounted over the outer flat ring-shaped mounting base-portion of the baffle shield member and from which an inner lip portion extends inwardly. The inner lip portion has a rounded contour to provide a smooth base for deposition of a smooth layer of sputtered material on said lip portion. The shield member includes a cylindrical sleeve portion, which is fixed to the annular ring base portion and which extends over the exterior wall of the cylindrical mounting structure to provide shielding of the exterior wall of the cylindrical mounting structure.

6 Claims, 2 Drawing Sheets 5,240,580

CONMAG SHIELD

BACKGROUND OF THE INVENTION

1. Field of the Invention

This invention relates to sputtering equipment for deposition of thin-film materials and, more particularly, to improved shielding for such equipment.

2. Prior Art

Sputtering is a physical process used for the deposition of thin films materials. Sputtering uses the kinetic energy of accelerated ions of an inert gas, such as argon, to transfer energy to the materials of a target. Upon impact by the accelerated ions, molecules of the target material are dislodged from the surface of a target. The dislodged molecules form a vapor which is then deposited on a desired substrate. Sputtering processes are used to deposit thin films of a variety of sputtered materials on a variety of surfaces. Sputtering is often used where thin-film chemical-vapor deposition (CVD) cannot be used, such as, for example, for depositing refractory materials.

FIG. 1 illustrates a prior art sputter source 10. The sputter source 10 typically is one station of a multi-station assembly for performing various processing steps on a semiconductor wafer. At each station a specific processing function is performed. For example, the sputter source 10 provides a source of Ti/W material to be deposited on the surface of a wafer. Each of the stations is arranged in a circular pattern on a large rear mounting plate 12. The wafers are mounted to carriers which are rotated, or stepped, to the various stations on the mounting plate 12.

The sputter source 10 includes an anode 13 and a ring-shaped Ti/W cathode, or target, 14. Energized argon ions bombard the surface of the cathode 14 to continuously generates a cloud of ions of sputtered Ti/W material. The sputtered Ti/W ions are contained close to the sputter source 10 by a movable shutter 16. The movable shutter 16 is mounted to a shaft 18, which is rotatably mounted to the rear plate 12. A wafer is positioned adjacent to the shutter 16 and the shutter 16 is rotated to expose the wafer to ions from the sputter source 10 for a predetermined time to form a film of sputtered material on the exposed surface of the wafer.

The anode 13 and the cathode target-ring 14 are mounted to a cylindrical weldment, or mounting structure 20, which extends perpendicularly from the rear mounting plate 12. Mounted to the distal end of the cylindrical mounting structure 20 is a water-cooled cooling ring 22. A baffle shield member has an outer flat ring-shaped base portion 24, which overlies the water-cooled cooling ring 22. From the flat ring-shaped base portion 24 extends a baffle portion 26, which extends inwardly and which provides a barrier for sputtered material. The flat ring-shaped base portion 24 of the baffle shield is fixed to the distal end of the cylindrical mounting structure 20 with a number of bolts, typically shown as 28.

A front shield assembly 30 includes a cylindrical front shield 32 which is attached to a flat annular disk member 34. The cylindrical front shield 32 surrounds the outside surface of the end of the cylindrical mounting structure 20. The disk member 34 projects over the flat ring-shaped base portion 24 of the baffle shield. The front shield assembly 30 is fixed to the cylindrical mounting structure with screws (typically shown as 36).

A space, or gap, 40 is formed between the base 24 and the disk member 34. The heads of the bolts 28 are contained within the gap 40. One problem with this prior art sputter source is that the space, or gap, 40 formed between the base 24 and the disk member 34 permits sputtered material in a powdery form to be deposited on the surfaces within the gap. Sputtered material is also deposited on the base of the cylindrical mounting structure, which is not covered by a shield. This powdery material flakes off and contaminates the surface of a wafer being sputter-coated.

FIG. 2 shows that the inner lip 42 of the annular disk member 34 forms a flat, squared edge with sharp corners. Sputtered material is deposited on the inner sharp corner of the lip 42 and forms a deposit 44 as indicated in the Figure. Ti/W material is brittle and as the front shield is heated and cooled, the sputtered material such as Ti/W, on the sharp corner of the lip of the front shield flakes away to also contaminate the surface of a wafer being processed.

Consequently, the need has arisen for a shielding arrangement which reduces flaking of deposited sputtered material from the base of the cylindrical mounting structure and from the gap between the base 24 of the baffle shield member and the disk member 34.

SUMMARY OF THE INVENTION

It is therefore an object of the invention to provide an improved shielding arrangement for a sputter source.

In accordance with this and other objects of the invention, an improved shielding assembly for a sputter source is provided. The sputter source provides refractory sputtered material for deposition on a substrate, such as a semiconductor wafer. The sputter source includes a rear base mounting plate from which perpendicularly extends a cylindrical mounting structure. Mounted to the distal end of the cylindrical mounting structure are an anode and a cathode target-ring. A baffle shield member has an outer flat ring-shaped mounting base-portion which overlies a cooling assembly for the sputter source. A baffle shield member extends inwardly extends toward the anode and the cathode from the flat ring-shaped mounting base-portion.

The invention provides a shield member which has a ring-shaped base portion, which is mounted over the outer flat ring-shaped mounting base-portion of the baffle shield member. Extending inwardly from the flat ring-shaped mounting base-portion of the baffle shield member, is an inner lip portion, where the inner lip portion has a rounded contour to provide a smooth base for deposition of a smooth layer of sputtered material on said lip portion. This reduces flaking of deposited sputtered material as temperature is cycled.

The cylindrical mounting structure has a cylindrical exterior wall and the shield member includes a cylindrical sleeve portion which is fixed to the ring base portion and which extends over the exterior wall of the cylindrical mounting structure to provide shielding of the exterior wall of the cylindrical mounting structure.

Means are provided for fixing the ring base portion of the shield member to the distal end of the cylindrical mounting structure, including one or more fasteners, such as screws.

A method of shielding portions a sputter source is provided according to the invention. The sputter source includes a rear base mounting plate from which perpendicularly extends a cylindrical mounting structure. Mounted to the cylindrical mounting structure are a pole-piece and an anode and a cathode target-ring assembly, which is attached to the distal end of the cylindrical mounting structure. A cooling assembly is attached to the distal end of the cylindrical mounting structure.

The cooling assembly is overlaid with a baffle shield member which has an outer flat ring-shaped mounting base-portion and inwardly extending a baffle portion of the baffle shield member, which extends toward the anode and cathode assembly.

The method includes the step of mounting a shield member having a ring base portion over the outer flat ring-shaped mounting base-portion of the baffle shield member and extending an inner lip portion from the ring base portion, where the inner lip portion is provided with a rounded contour to provide a smooth base for deposition of a smooth layer of sputtered material on said lip portion.

The method includes the further step of covering cylindrical exterior wall of the cylindrical mounting structure with a long cylindrical sleeve portion fixed to the ring base portion so that the long cylindrical sleeve extends over the exterior wall of the cylindrical mounting structure to provide shielding of the exterior wall of the cylindrical mounting structure.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

The invention replaces the front shield of the prior art with an improved front shield which has a rounded inner lip. The improved front shield also has an elongated cylindrical sleeve which covers the exterior surface of the cylindrical mounting structure.

Figure 1:
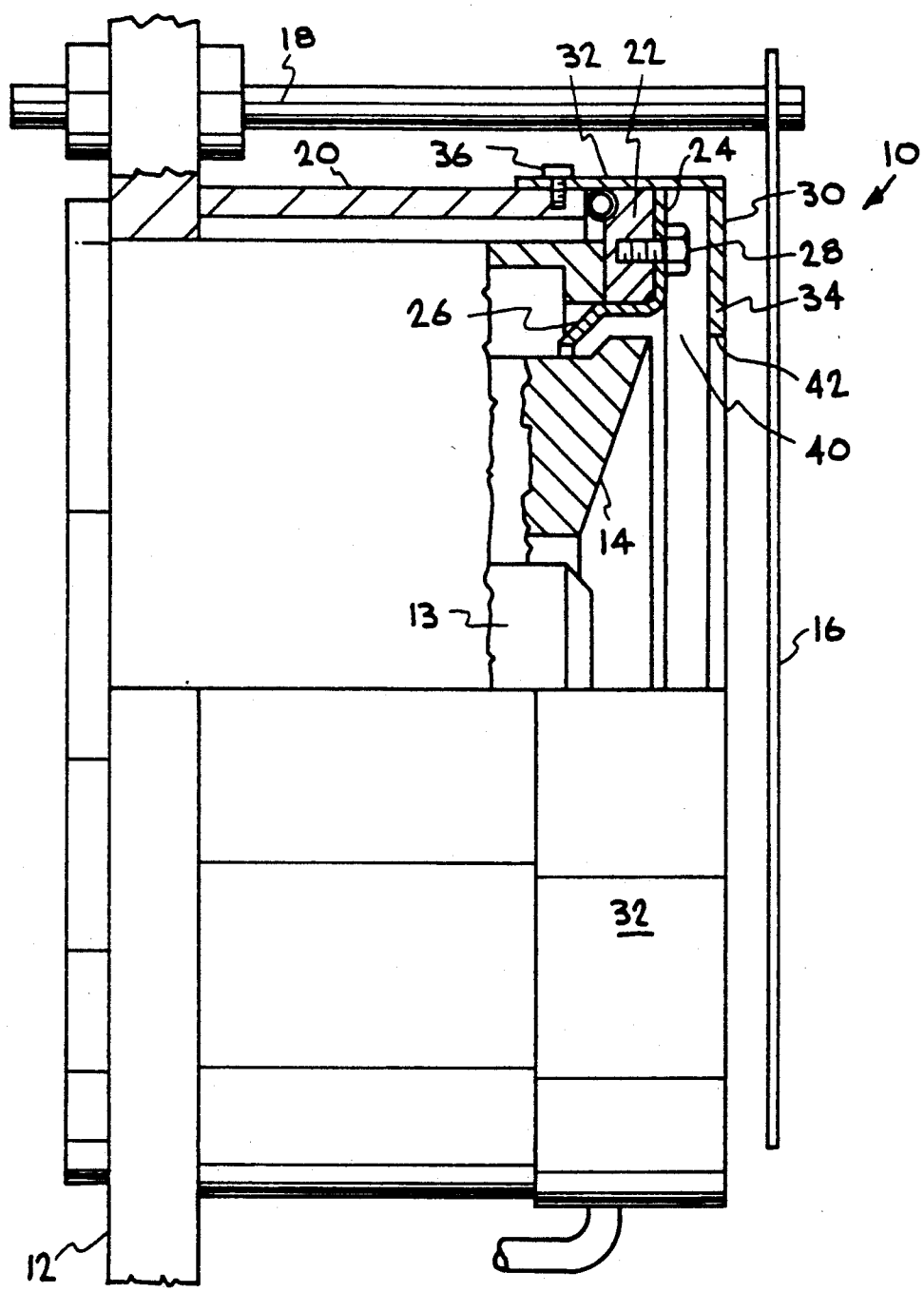
FIG. 1 is a partially sectional view of a prior art sputter source and its shielding arrangement.
Figure 2:
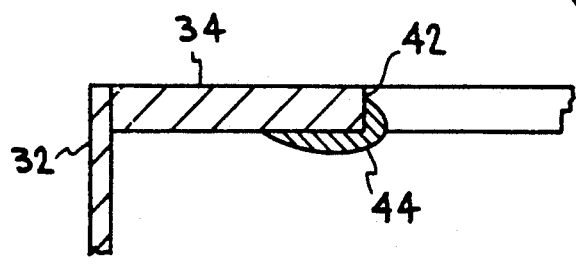
FIG. 2 is an enlarged sectional view of the lip portion of the front shield for the shielding arrangement of the prior art sputter source of FIG. 1.
Figure 3:
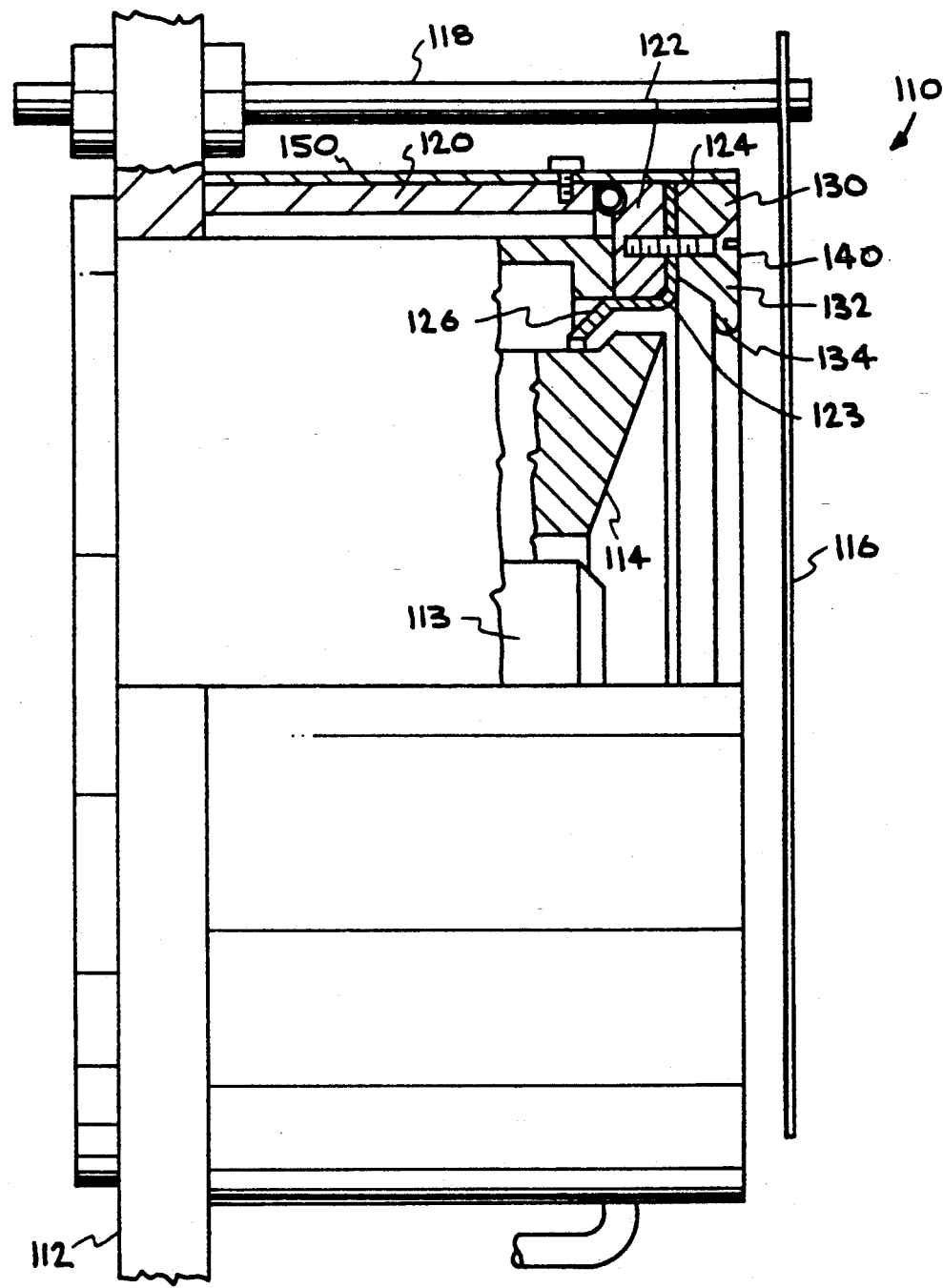
FIG. 3 is a partially sectional view of a shielding arrangement for a sputter source according to the invention.

FIG. 3 illustrates an improved shielding arrangement for a sputter source 110 according to the invention. This source is similar to that previously described in connection with FIG. 1 of the drawings. The sputter source 110 typically is one station of a multi-station assembly for performing various processing steps on a semiconductor wafer, where a specific processing function is performed at each station. The sputter source 110 functions as a source of Ti/W material to be deposited on the surface of a semiconductor wafer. Each of the stations of the multi-station assembly is arranged in a circular pattern on a large rear mounting plate 112 and the wafers are mounted on carriers which are rotated, or stepped, to the various stations on the mounting plate 112.

The sputter source 110 includes an anode 113 and a ring-shaped Ti/W cathode, or target, 114. Energized argon ions bombard the surface of the cathode 114 to continuously generates a cloud of ions of sputtered Ti/W material. The sputtered Ti/W ions are contained close to the sputter source 110 by a movable shutter 116. The movable shutter 116 is mounted to a shaft 118, which is rotatably mounted to the rear plate 112. A wafer is positioned adjacent to the shutter 116, which is rotated to expose the wafer to sputtered ions from the sputter source 110 for a predetermined time to form a film of sputtered material on the exposed surface of the wafer.

The anode 113 and the cathode target-ring 114 are mounted to a cylindrical weldment, which serves as a mounting structure 120, and which extends perpendicularly from the rear mounting plate 112. Mounted to the distal end of the cylindrical mounting structure 120 is a water-cooled cooling ring 122. A baffle shield member 123 has an outer flat, ring-shaped base portion 124, which overlies the water-cooled cooling ring 122. From the flat ring-shaped base portion 124 extends a baffle portion 126, which extends inwardly toward the cathode ring 114 and which provides a barrier for sputtered material. The flat ring-shaped base portion 124 of the baffle shield is fixed to the distal end of the cylindrical mounting structure 120.

An improved one-piece front shield member 130 includes an annular ring base portion 132 which is mounted over the outer flat ring-shaped mounting base-portion 124 of the baffle shield member 123. An inner lip portion 134 extends inwardly from the annular ring mounting base-portion 132. The inner lip portion 134 has a rounded contour to provide a smooth base for deposition of a smooth layer of sputtered material thereupon. The annular ring base portion 132 of the shield member 130 is shaped as an annular disk and is attached to the distal end of the cylindrical mounting structure 120 using a number of countersunk screws (typically shown as 140). The screws are threaded through the flat ring-shaped base portion 124 of the baffle shield member and into the cooling ring 122, as illustrated in the Figure. This configuration of the annular ring base portion 132 of the shield member 130 eliminates a gap, such as shown by reference numeral 40 in FIG. 1, to eliminate sites for buildup of sputtered material.

Figure 4:
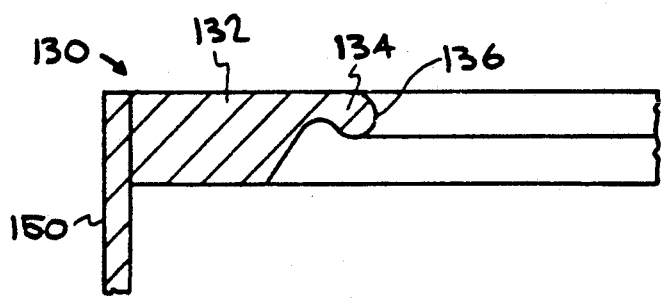
FIG. 4 is an enlarged sectional view of the lip portion of the front shield of the shielding arrangement of the sputter source of FIG. 3, according to the invention.

FIG. 4 shows that the inner lip 134 of the annular disk member 132 has a rounded, protruding nose portion 136. Sputtered material is deposited on the rounded surface of the lip 132 to form a smoothly contoured layer of deposited, sputtered material. Even though the Ti/W material in the layer is brittle, it is under less stress so that, as the front shield is heated and cooled, the sputtered material deposited on the lip of the front shield tends not to flake away and contaminate the surface of a wafer being processed.

The shield member 130 includes a long cylindrical sleeve portion 150 which is fixed to the ring base 132 and which extends over the exterior wall of the cylindrical mounting structure 120 to shield that wall from buildup of sputtered material. This facilitates routine maintenance because the shield can be removed and replaced, removing the necessity to clean the exterior surface of the cylindrical mounting structure 120.

The invention provides an improved method for shielding various parts of the sputter source 110, which provides, for example, refractory sputtered material, such as Ti/W, for deposition on a semiconductor substrate. The method includes shielding with a baffle shield member which has an outer flag ring-shaped mounting base-portion 124 and an inwardly extending a baffle portion 126.

A shield member 130 has a ring base portion 132 positioned over the outer flat ring-shaped mounting base-portion 124 of the baffle shield member. An inner lip portion 134 extends from the annular ring base portion 132 and has a rounded contour to provide a smooth base for deposition of a smooth layer of sputtered material on the lip. This reduces stress and flaking within the layer of material as it is cycled through hot and cold temperatures.

The invention includes covering the cylindrical exterior wall of the cylindrical mounting structure 120 with a long cylindrical sleeve portion 150 of the shield member 130. The sleeve 150 is fixed to the ring base portion 124 and is extended over the exterior wall of the cylindrical mounting structure to provide shielding.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. An improved shielding assembly for a sputter source which provides refractory sputtered material for deposition on a substrate, the sputter source including a rear base mounting plate from which extends a cylindrical mounting structure, mounted to the cylindrical mounting structure are an anode and cathode target-ring assembly, mounted to the distal end of the cylindrical mounting structure is a cooling assembly for the anode and cathode target-ring assembly, the improved shielding assembly comprising:
   a baffle shield member which has an outer flat ring-shaped mounting base portion which overlies the cooling assembly and from which a baffle portion inwardly extends toward the anode and cathode target-ring assembly;
   a front shield member comprising an annular ring base portion, which is mounted over the outer flat ring-shaped mounting base-portion of the baffle shield member, said annular ring base portion of said front shield member having an inner lip portion which extends inwardly, said inner lip portion of said annular ring base portion of said front shield member having a rounded contour to provide a smooth base for deposition of a smooth layer of sputtered material on said inwardly extending lip portion of said annular ring base portion of said front shield member; and
   means for fixing the annular ring base portion of the front shield member to the distal end of the cylindrical mounting structure over the outer flat ring-shaped mounting base-portion of the baffle shield member.

2. The shielding assembly of claim 1 wherein the cylindrical mounting structure has a cylindrical exterior wall and wherein the front shield member includes a cylindrical sleeve portion fixed to the annular ring base portion of the front shield so that the cylindrical sleeve portion extends over the exterior wall of the cylindrical mounting structure to provide shielding of the exterior wall of the cylindrical mounting structure.

3. The shielding assembly of claim 1 wherein the means for fixing the annular ring base portion of the front shield member to the distal end of the cylindrical mounting structure includes one or more screw fasteners.

4. A method of shielding portions of a sputter source, which provides refractory sputtered material for deposition on a substrate, the sputter source including a rear base mounting plate from which extends a cylindrical mounting structure, mounted within the cylindrical mounting structure are an anode and a cathode target-ring assembly, mounted to the distal end of the cylindrical mounting structure is a cooling assembly for the anode and cathode target-ring assembly, the method comprising the steps of:
   overlying the cooling assembly with a baffle shield member which has an outer flat ring-shaped mounting base-portion and a baffle portion of the baffle shield member, which baffle portion extends inwardly toward the anode and cathode target-ring assembly;
   mounting a front shield member having an annular ring base portion over the outer flat ring-shaped mounting base-portion of the baffle shield member, inwardly extending an inner lip portion from the annular ring base portion of the front shield member, and providing said inner lip portion extending from the annular ring base portion of the baffle shield member with a rounded contour to provide a smooth base for deposition of a smooth layer of sputtered material on said inwardly extending lip portion; and
   fixing the annular ring base portion of the front shield member to the distal end of the cylindrical mounting structure.

5. The method of claim 4 including the step of covering a cylindrical exterior wall of the cylindrical mounting structure with a cylindrical sleeve portion fixed to the annular ring base portion of the front shield member, said cylindrical sleeve portion extending over the exterior wall of the cylindrical mounting structure to provide shielding of the exterior wall of the cylindrical mounting structure.

6. The method of claim 4 wherein the step of fixing the annular ring base portion of the front shield member to the distal end of the cylindrical mounting structure includes fastening said base portion of the front shield member to the distal end of the cylindrical mounting structure with one or more threaded fasteners.

* * * * *